United States Patent [19]

Kitchens

[11] Patent Number: 5,161,403
[45] Date of Patent: Nov. 10, 1992

[54] METHOD AND APPARATUS FOR FORMING COPLANAR CONTACT PROJECTIONS ON FLEXIBLE CIRCUITS

[75] Inventor: Keith G. Kitchens, Simpsonville, S.C.

[73] Assignee: Digital Equipment Corporation, Maynard, Mass.

[21] Appl. No.: 720,969

[22] Filed: Jun. 25, 1991

[51] Int. Cl.⁵ .................. B21D 37/14; H01R 43/16
[52] U.S. Cl. ............................ 72/414; 72/446; 29/846; 29/882; 29/884
[58] Field of Search ............. 72/414, 412, 446, 340; 29/846, 882, 884, 445; 76/107.1

[56] References Cited

U.S. PATENT DOCUMENTS

| | | | |
|---|---|---|---|
| 1,105,489 | 7/1914 | Clement | 29/882 |
| 3,049,791 | 8/1962 | Shackman | 29/882 |
| 3,672,031 | 6/1972 | Negrini | 29/445 |
| 3,706,218 | 12/1972 | Elmer | 72/414 |
| 3,825,984 | 7/1974 | Linko | 29/889.721 |
| 3,847,700 | 11/1974 | Dalal | 29/846 |
| 4,116,517 | 9/1978 | Selvin et al. | |
| 4,121,044 | 10/1978 | Hadersbeck et al. | |
| 4,403,272 | 9/1983 | Larson et al. | |
| 4,407,066 | 10/1983 | Gunter | 29/882 |
| 4,483,171 | 11/1984 | Franek et al. | 72/347 |
| 4,490,904 | 11/1984 | Moyher | 29/864 |
| 4,648,180 | 3/1987 | Holt | 29/846 |
| 4,835,859 | 6/1989 | Beckett | 29/846 |
| 4,860,088 | 8/1989 | Smith et al. | |
| 4,891,014 | 1/1990 | Simpson | 29/846 |

OTHER PUBLICATIONS

Beam, W. D., "Selective Punching Apparatus", from Western Electric Technical Digest, No. 58, Apr., 1980, pp. 3, 4.

*Primary Examiner*—Daniel C. Crane
*Attorney, Agent, or Firm*—Cesari and McKenna

[57] ABSTRACT

Mechanical forming apparatus and method for manufacturing planar contact projections for a flexible circuit is disclosed. A forming die includes a punch assembly configured for mating with a die plate. The punch assembly comprises a pin plate coupled to a punch plate and configured to hold adjusting pins and forming punches, respectively. Each forming punch has a tail with a contoured tip that conforms to the geometry of a desired contact projection. The die plate has a plurality of cavities configured and dimensioned for receiving the tail tips of the punches. In operation, the punch assembly and die plate are placed in a die set and installed in an open position in a punch press with a flexible circuit positioned therein. When activated, the press closes the die set, causing the punch tails to push against the flexible circuit, while circuit material flows into the die plate cavities. As the cavities fill, any excess material is compressed into peripheral areas of the die plate surrounding the cavities. Accordingly, contact projections of a specific size and shape are formed.

7 Claims, 2 Drawing Sheets

METHOD AND APPARATUS FOR FORMING COPLANAR CONTACT PROJECTIONS ON FLEXIBLE CIRCUITS

FIELD OF THE INVENTION

This invention relates generally to mechanical forming dies and, more specifically, to a method and apparatus for forming coplanar electrical contact projections on a flexible circuit.

BACKGROUND OF THE INVENTION

Flexible circuits are commonly used in interconnection systems because of their ease of assembly to like circuits or to rigid circuit substrates such as printed circuit boards. A flexible circuit is typically connected to another circuit by forced contacts between electrical contact projections on the flexible circuit and conductive elements, such as traces, on a printed circuit board. Because of manufacturing tolerance variations in the heights of the contact projections, as much as 200 grams of force per projection may be needed to ensure reliable contact closure. For a circuit having at least 260 contact projections, this translates into a 52 kilogram force on the circuit, resulting in force-related material and contact failures in assembled units.

Flexible circuits with coplanar contact projections require less force to ensure reliable contact between the projections and conductive elements. However, the successful manufacture of coplanar contact projections has been difficult to achieve; attempts have ranged from photolithographic processes to mechanical extrusion-based processes.

For example, a photolithographic approach involves conventional deposition and etching processes to produce base contacts on a flexible circuit substrate. Copper is then electrodeposited on the base contacts to form the contact projections. This method may further include the use of a thicker base contact foil from which the contact projections are directly formed, thus eliminating the need for electroplating. Yet, thickness variations in the flexible circuit substrate typically alter the height, and thus coplanarity, of the contact projections.

In an alternate approach, a mechanical die extrudes the flexible circuit through unbounded holes to produce the contact projections. Specifically, the base contacts of the flexible circuit are electroplated with thick layers of copper. The circuit is placed in a press over a die plate that has holes corresponding to the desired contact projections. Extrusion pins are then forced down on the circuit to extrude the flexible circuit substrate material through the holes in the die plate and thereby form the projections. As above, the thickness variations in the flexible circuit substrate typically affect the coplanarity of the contact projections, since the projections are formed by means of unbounded holes. That is, the geometries of the the die plate holes and the die mating parts, i.e. extrusion pins, together with the force applied by the punch press determine the shape and planarity of the extruded contact projections.

SUMMARY OF THE INVENTION

An apparatus constructed in accordance with the invention comprises a punch assembly configured for mating coaction with a die plate to form planar contact projections in a flexible circuit. The die plate includes cavities dimensioned and configured to receive forming punches of the punch assembly when a flexible circuit is positioned therebetween. Specifically, each forming punch has a tail with a contoured tip that conforms to the geometry of a desired contact projection. Similarly, each cavity has a depth and shape that conforms to the contour of the desired projection. The punch assembly also includes adjusting pins for adjusting the lengths of the punches; this ensures that the tips of all the punches are planar prior to forming the contact projections.

In operation, the punch assembly and die plate are placed in a die set and installed in an open position in a punch press with a flexible circuit positioned therein. When activated, the press closes the die set and applies pressure to the punches. The punch tails press against the flexible circuit, causing circuit substrate material to flow into the die plate cavities. As the cavities fill, excess material is compressed into peripheral areas of the die plate surrounding the cavities. Accordingly, the contact projections and the supporting substrate are plastically deformed to a specific size and shape and, as will be seen, the projection tips are very closely coplanar.

Specifically, the mechanical forming apparatus provides control over the geometric tolerances of the contact projections because the final structure of the projections is determined by the shapes and lengths of the punches and the depths of the cavities. With only minute variations in these dimensions, all contact projections produced on the flexible circuit are essentially coplanar, with almost identical geometrical characteristics, in spite of thickness variations in the circuit substrate.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
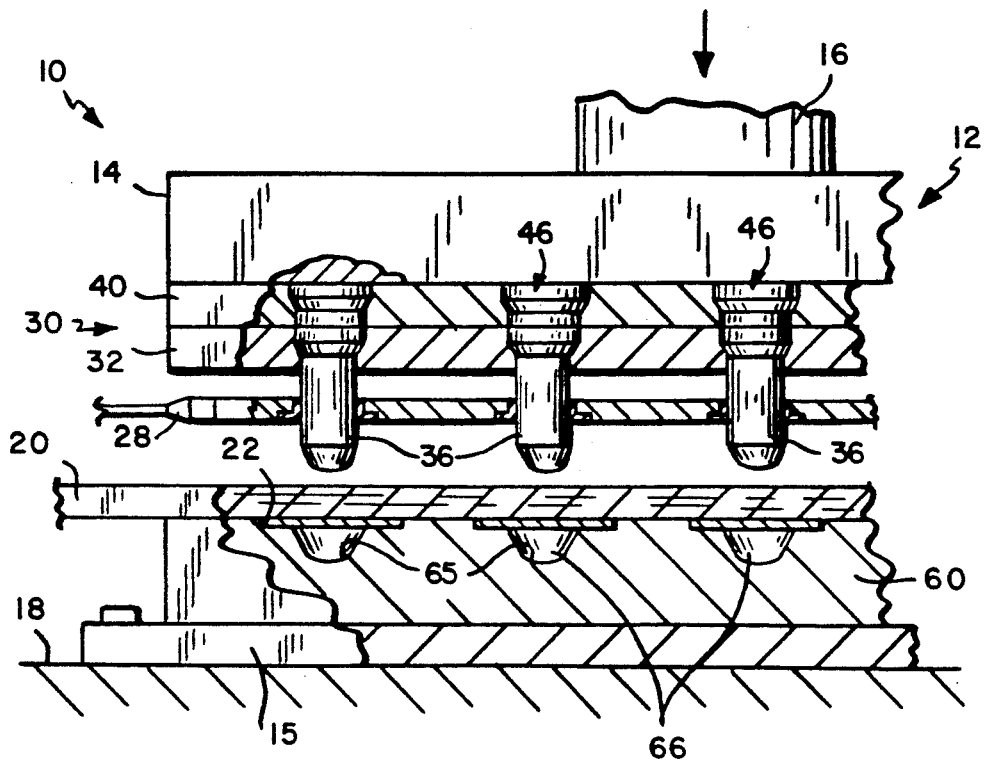
FIG. 1 is cross-sectional isometric view of the components of a forming die set in accordance with the invention.

Referring to FIG. 1, a forming die 10 comprises a punch assembly 30 and a die plate 60 mounted in a die set 12 and adapted for operation in a conventional punch press (not shown). As described below, the die 10 forms coplanar electrical interconnects or contact projections in a flexible circuit 20 disposed between the punch assembly 30 and die plate 60. The die set 12 includes a holder 14 for retaining the punch assembly 30 and a shoe 15 that supports the die plate 60 on a bolster plate 18. The drive of the punch press may be either mechanical or hydraulic; when activated, the press drives a ram 16 into the holder 14 and moves it downward over the shoe 15, thereby forcing the punch assembly 30 into coaction with the die plate 60.

More specifically, the punch assembly 30 includes a punch plate 32 that supports a plurality of forming punches 36 and a pin plate 40 containing adjusting pins 46. The die plate 60 comprises a plurality of forming cavities 66. When assembled for mating coaction within the punch press, the punches 36 and die plate cavities 66 produce contact projections in a flexible circuit 20.

Figure 2:
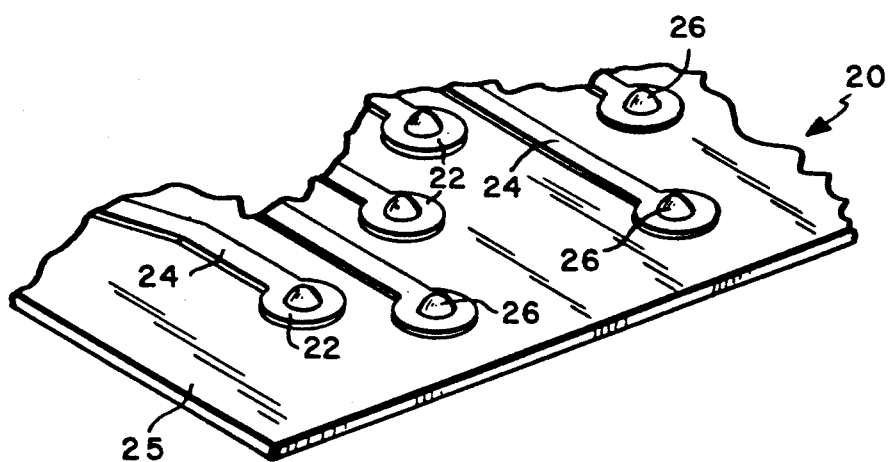
FIG. 2 is a partial isometric view of a flexible circuit containing planar contact projections formed in accordance with the invention.

The flexible circuit 20, depicted in FIG. 2, is a high-density, controlled-impedance connector used to transmit signals between conductive elements of an interconnection system. The circuit 20 is composed of alternating layers of dielectric material, e.g. polyimide, and conductive material, e.g. copper, and adhesive material. Circular conductive pads 22, arranged in an off-grid pattern, terminate conductive strips 24 located on an upper surface 25 of the flexible circuit 20. Contact projections 26 are formed in the conductive pads 22 to concentrate contact forces into small areas when connecting the projections 26 to other conductive elements (not shown) in a circuit assembly. In order to reduce the total contact force required to ensure reliable contact connection, the contact projections are preferably manufactured "planar" to each other; that is, the projections preferably have a height tolerance of 0.0002". The forming die invention disclosed herein produces such planar contact projections.

Figure 3:
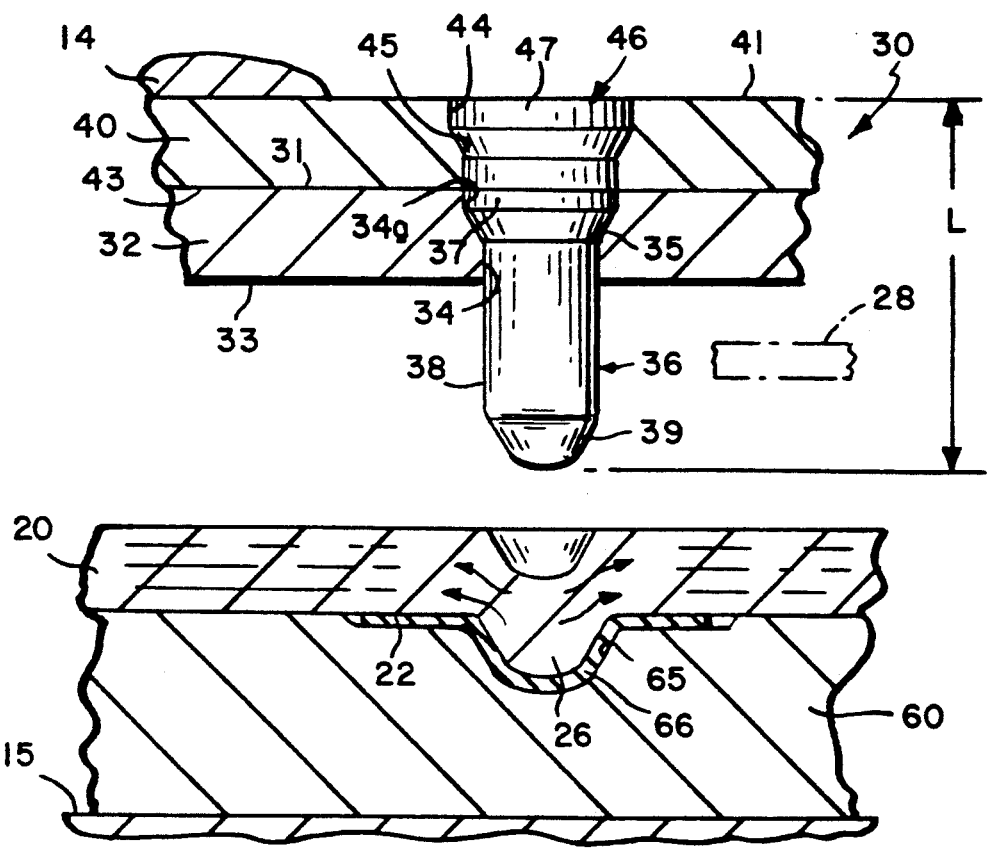
FIG. 3 is an enlarged, partial cross-sectional view of a contact projection formed in the flexible circuit by the punch assembly and die plate in accordance with the invention.

As noted and referring to FIGS. 1 and 3, the punch assembly 30 includes forming punches 36 contained within a punch plate 32. The punch plate 32 is a generally rectangular member made of a high grade tool steel with generally planar, highly finished upper and lower surfaces, shown at 31 and 33 respectively. A plurality of generally round bores 34 extend upward from the lower surface 33 of the plate 32. Counterbores 34a extend down from the upper surface 31, with shoulders 35 joining the bores 34 and 34a. The lower surface 33 of the punch plate 32 is adapted for fitting a mechanical stripper plate 28 to aid in the removal of a pressed flexible circuit 20.

The contact projections 26 are produced in part by the forming punches 36. Each punch 36 has a head portion 37 shaped like a knob and dimensioned to seat against the shoulder 35 of a respective punch bore 34. When inserted into the bore, the head 37 protrudes slightly above the upper surface 31 of the punch plate 32, i.e. preferably 0.005", to enable planar surface grinding of the punch and plate.

The punch 36 also includes a tail 38 extending below the lower surface 33 of the plate 32. The tail 38 has a tip 39 whose contour conforms to the desired shape of a contact projection 26. The punch 36 is preferably long enough to extend through the mechanical stripper plate 28, if the latter is used.

During initial construction of the punch assembly 30, the forming punches 36 are inserted into respective punch bores 34 and the resultant sub-assembly is placed in a grinding fixture (not shown). The portions of the punch heads 37 extending above the punch plate 32 are then ground to provide a continuous upper surface 31 of the plate 32.

The pin plate 40 is a generally rectangular member similar in dimension and construction to the punch plate 32. Accordingly, the pin plate 40 has planar upper and lower surfaces 41 and 43 with a plurality of pin apertures 44 extending between the surfaces. Each pin aperture 44 is counterbored adjacent to the upper surface 41 of the plate 40 to form a shoulder 45 for receiving and retaining an adjusting pin 46 that fits the aperture. The lower portions of the pin apertures 44 are of the same diameter as that of the counterbores 34a in the plate 32; as will be described later, each pin aperture 44 is aligned with a respective counterbore 34 in the punch plate 32.

Each adjusting pin 46 is used to adjust the height and length of a respective punch 36 prior to formation of a contact projection 26. The pins 46 extend at least 0.005" beyond the upper and lower surfaces 41 and 43 of the plate 40 to enable precision grinding of the pins 46 when the punch assembly 30 is fully assembled. Each pin 46 includes a knob-like head 47 that seats firmly against the shoulder 45 of the aperture 44 containing the pin.

To complete construction of the punch assembly 30, the upper surface 31 of the punch plate 32 is affixed to the lower surface 43 of the pin plate 40 with the punches 36 in alignment with the adjusting pins 46. The punch assembly 30 is then "planarized" in the grinding fixture by removing any excess adjusting pin length above the plate 40, i.e. the adjusting pins 46 are ground to the upper surface 41 of the plate 40, so that the punch tip 39 to upper surface 41 length L is the same for each forming punch 36 in the punch assembly 30.

The die plate 60 is provided with a plurality of cavities 66 by conventional electrical discharge machining (EDM). Specifically, the cavities 66 are formed using a carbon or metallic electrode shaped to the geometric contour of a desired electrical contact projection. The cavities 66 are aligned to receive the punches 36 during contact projection formation. Once the cavities are formed to the correct depth and shape, the interior surfaces 65 thereof are polished, e.g. mechanically or electrochemically, to a mirror finish. At this point, registration pins (not shown) may be inserted into suitably positioned holes in the die plate 60 to provide registration between the flexible circuit 20 and the cavities 66.

The die plate 60 and punch assembly 30 are then fitted to the forming die set 12 and positioned within a conventional hydraulic or mechanical punch press (not shown). With the die set 12 in an open position, the flexible circuit 20 is placed on the die 10 with the circuit pads 22 in registration with the cavities 66. Activation of the press closes the die set 12 and applies pressure to the forming punches 36. The press is activated to force the forming punches 36 against the flexible circuit 20.

Specifically, the tips 39 of the punches 36 push against the flexible circuit substrate material directly beneath the pads 22 to create an impression therein. The substrate material is forced into the cavities 66 and eventually fills them; meanwhile, any excess material is compressed into the peripheral areas of the die plate 60 surrounding the cavities 66. The excess material, which is primarily adhesive, actually compresses and flows outward away from the cavities 66. Such compression effectively negates any thickness variations in the circuit material. As a result, the conductive pads 22 and flexible circuit material are plastically deformed, thereby producing coplanar electrical contact projections 26 within the tolerances of the precisely machined cavities 66, i.e. typically 0.0002".

An advantage of the forming die invention includes greater control over the geometry of the electrical contact projections 26 of a flexible circuit 20 than prior mechanical extrusion or photolithographic techniques. The structure of the projections is controlled, in part, because the cavities 66 are precisely formed in the die plate 60. For example, the depth of each cavity 66 formed in the die plate 60 by the EDM process will typically provide a depth tolerance of 0.00005". In addition, the adjusting pins 46 provide the flexibility needed to compensate for punch assembly tolerances, i.e. the tolerances of the forming punches 36 and mating plates 32 and 40. Accordingly, the forming die 10 significantly increases the yield of acceptable planar contact projections 26 of the flexible circuit 20, even given the thickness variations in the circuit materials.

Prior mechanical extrusion processes create non-symmetrical distortion (NSD) and cluster density effect (CDE) when the electrical contact projections are arranged in an "off-grid" pattern. NSD and CDE both adversely impact coplanarity among the projections. Furthermore, the extrusion techniques have no inherent functional mechanism to compensate for material thickness variations among circuits to produce "planar" electrical projections. For example, the prior manufacturing techniques produce contact projections having height variations generally within 0.0007". In contrast, the forming die invention described herein realizes contact projections within a 0.0002" height tolerance. These "planar" projections require 30 grams of force per contact or 7.8 kilograms of pressure on a flexible circuit having 260 projections; this represents approximately an 85% reduction in the force required for reliable contact closure of the projections.

In addition, the mechanical forming method and apparatus set forth herein require fewer manufacturing operations than prior photolithographic attempts, thereby substantially reducing the cost of manufacturing the planar contact projections. Also, standard punch presses fitted for the forming die invention may be used to produce the contact projections, thus avoiding costly precision presses.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A method for forming coplanar contact projections of a specific geometry from material of a flexible circuit comprising the steps of:

constructing a punch assembly to have (a) a plurality of forming punches, each having a knob-like head and a tail with a contoured tip conforming to the geometry of said contract projections, and (b) a plurality of adjusting pins, each having a knob-like head, said step of constructing further comprising the steps of:

positioning said forming punches in a punch plate;
positioning said adjusting pins in a pin plate; and
coupling said pin plate to said punch plate such that each adjusting pin is superimposed on a respective forming punch;

equalizing the effective heights and lengths of said forming punches by adjusting the lengths of said adjusting pins superimposed thereon;

constructing a die plate for mating coaction with said punch assembly, said die plate including a plurality of cavities configured, dimensioned and arranged for receiving said tail tips of said punches;

fitting said punch assembly and said die plate to a die set configured for operation in a press; and closing said die set with the flexible circuit positioned between said punch assembly and said die plate so that a force is applied to said forming punches and said punch tails push against the flexible circuit, thereby forcing the material of the flexible circuit into said cavities of said die plate as excess circuit material flows and compresses into peripheral areas of said die plate surrounding said cavities to plastically deform portions of the flexible circuit to form said contact projections.

2. The method of claim 1 wherein the step of constructing said punch assembly further includes the steps of:

constructing said punch plate to have a plurality of punch bores and counterbores joined by shoulders dimensioned and configured for seating contact relation with said heads of said forming punches; and constructing said pin plate to have a plurality of pin apertures counter bored adjacent to an upper surface of said pin plate to form shoulders for holding said adjusting pins, each of said apertures including a lower portion having a diameter equivalent to the diameter of said counterbores of said punch plate.

3. Apparatus for forming coplanar contact projections of a specific geometry from material of a flexible circuit comprising:

means for constructing a punch assembly to have (a) a plurality of forming punches, each having a knob-like head and a tail with a contoured tip conforming to the geometry of said contact projections, and (b) a plurality of adjusting pins, each having a knob-like head, said constructing means further comprising:

means for positioning said forming punches in a punch plate;
means for positioning said adjusting pins in a pin plate; and
means for coupling said pin plate to said punch plate such that each adjusting pin is superimposed on a respective forming punch;

means for equalizing the effective heights and lengths of said forming punches by adjusting the lengths of said adjusting pins superimposed thereon;

means for constructing a die plate for mating coaction with said punch assembly, said die plate including a plurality of cavities configured, dimensioned and arranged for receiving said tail tips of said punches;

means for fitting said punch assembly and said die plate to a die set configured for operation in a press; and means for closing said die set with the flexible circuit positioned between said punch assembly and said die plate so that a force is applied to said forming punches and said punch tails push against the flexible circuit, thereby forcing the material of the flexible circuit into said cavities of said die plate as excess circuit material flows and compresses into peripheral areas of said die plate surrounding said cavities to plastically deform portions of the flexible circuit to form said contact projections.

4. The apparatus of claim 3 wherein said means for constructing said punch assembly further comprises:

means for constructing said punch plate to have a plurality of punch bores and counterbores joined by shoulders dimensioned and configured for seating contact relation with said heads of said forming punches; and means for constructing said pin plate to have a plurality of pin apertures counterbored adjacent to an upper surface of said pin plate to form shoulders for holding said adjusting pins, each of said apertures including a lower portion having a diameter equivalent to the diameter of said counterbores of said punch plate.

5. A method for forming coplanar contact projections of a specific geometry from material of a flexible circuit comprising the steps of:
A. constructing a punch assembly to have:
a plurality of forming punches, each having a knob-like head and a tail with a contoured tip conforming to the geometry of said contact projections;
a plurality of adjusting pins, each being superimposed on a respective forming punch;
a punch plate including a plurality of punch bores and counterbores joined by shoulders dimensioned and configured for seating contact relation with said heads of said forming punches; and
a pin plate including a plurality of pin apertures for holding said adjusting pins, each of said apertures including a lower portion having a diameter equivalent to the diameter of said counterbores;
B. coupling said pin plate to said punch plate with said adjusting pins and forming punches respectively positioned therein, such that each adjusting pin is aligned with a respective forming punch;
C. equalizing the effective heights and lengths of said forming punches by adjusting the lengths of said adjusting pins superimposed thereon;
D. constructing a die plate for mating coaction with said punch assembly, said die plate including a plurality of cavities configured, dimensioned and arranged for receiving said tail tips of said punches;
E. fitting said punch assembly and said die plate to a die set configured for operation in a press; and
F. closing said die set with the flexible circuit positioned between said punch assembly and said die plate so that a force is applied to said forming punches and said punch tails push against the flexible circuit,
thereby forcing the material of the flexible circuit into said cavities of said die plate as excess circuit material flows and compresses into peripheral areas of said die plate surrounding said cavities to plastically deform portions of the flexible circuit to form said contact projections.

6. Apparatus for forming coplanar contact projections of a specific geometry from material of a flexible circuit comprising:
A. means for constructing a punch assembly to have:
a plurality of forming punches, each of said punches having a knob-like head and a tail with a contoured tip conforming to the geometry of said contact projections;
a plurality of adjusting pins, each of said pins being superimposed on a respective forming punch;
a punch plate including a plurality of punch bores and counterbores joined by shoulders dimensioned and configured for seating contact relation with said heads of said forming punches;
a pin plate including a plurality of pin apertures for holding said adjusting pins, each of said apertures including a lower portion having a diameter equivalent to the diameter of said counterbores;
B. means for coupling said pin plate to said punch plate with said adjusting pins and forming punches respectively positioned therein, such that each adjusting pin is aligned with a respective forming punch;
C. means for equalizing the effective heights and lengths of said forming punches by adjusting the lengths of said adjusting pins superimposed thereon;
D. means for constructing a die plate for mating coaction with said punch assembly, said die plate including a plurality of cavities configured, dimensioned and arranged for receiving said tail tips of said punches;
E. means for fitting and punch assembly and said die plate to a die set configured for operation in a press; and
F. means for closing said die set with the flexible circuit positioned between said punch assembly and said die plate so that a force is applied to said forming punches and said punch tails push against the flexible circuit,
thereby forcing the material of the flexible circuit into said cavities of said die plate as excess circuit material flows and compresses into peripheral areas of said die plate surrounding said cavities to plastically deform portions of the flexible circuit to form said contact projections.

7. A die forming coplanar contact projections of a specific geometry from material of a flexible circuit, said die configured for installation in a press capable of applying pressure to said die, said die comprising:
a punch assembly including a plurality of forming punches, each of said punches having a knob-like head and a tail with a contoured tip conforming to the geometry of said contact projections, said punch assembly further comprising:
a punch plate including a plurality of punch bores and counterbores joined by shoulders dimensioned and configured for seating contact relation with said heads of said forming punches;
a plurality of adjusting pins, each configured for superimposed relation with a respective forming punch so as to adjust the height and length of said respective forming punch; and
a pin plate including a plurality of pin apertures for holding said adjusting pins, each of said apertures including a lower portion having a diameter equivalent to the diameter of said counter bores, said pin plate being affixed to said punch plate with said adjusting pins and said forming punches respectively positioned therein, such that each adjusting pin is aligned with a respective forming punch;
a die plate including a plurality of cavities configured, dimensioned and arranged for receiving said tail tips of said punches; and
a die set configured to encompass said punch assembly for mating coaction with said die plate, said die set further configured for operation in the press,
whereby said contact projections are formed when said die set is closed with the flexible circuit positioned between said punch assembly and said die plate and pressure is applied to said forming punches such that such punch tails push against the flexible circuit, thereby forcing the material of the flexible circuit to flow into said cavities of said die plate as any excess circuit material is compressed into peripheral areas of said die plate surrounding said cavities.

* * * * *